(12) United States Patent
Choi et al.

(10) Patent No.: US 12,136,653 B2
(45) Date of Patent: Nov. 5, 2024

(54) SILICON CARBIDE WAFER AND SEMICONDUCTOR DEVICE APPLIED THE SAME

(71) Applicant: SENIC Inc., Cheonan-si (KR)

(72) Inventors: Jung Woo Choi, Cheonam-si (KR); Jong Hwi Park, Cheonam-si (KR); Jung-Gyu Kim, Cheonam-si (KR); Jung Doo Seo, Cheonam-si (KR); Kap-Ryeol Ku, Cheonam-si (KR)

(73) Assignee: SENIC Inc., Cheonan-si (KR)

( * ) Notice: Subject to any disclaimer, the term of this patent is extended or adjusted under 35 U.S.C. 154(b) by 174 days.

(21) Appl. No.: 17/692,528

(22) Filed: Mar. 11, 2022

(65) Prior Publication Data

US 2022/0320296 A1    Oct. 6, 2022

(30) Foreign Application Priority Data

Mar. 30, 2021    (KR) .................. 10-2021-0041021

(51) Int. Cl.
*H01L 29/16* (2006.01)
*H01L 21/02* (2006.01)

(52) U.S. Cl.
CPC .... *H01L 29/1608* (2013.01); *H01L 21/02002* (2013.01)

(58) Field of Classification Search
CPC .......... H01L 29/1608; H01L 21/02002; H01L 21/02008; H01L 21/02529; H01L 21/02598; H01L 21/0262; H01L 22/12; H01L 21/02378; H01L 29/1604; H01L 29/161–167; H01L 21/0445–0495; H01L 29/66053–66068; C30B 29/36; C30B 23/06; C30B 23/00; G01N 21/9505; C01B 32/956–984

See application file for complete search history.

(56) References Cited

U.S. PATENT DOCUMENTS

| | | | |
|---|---|---|---|
| 2012/0280254 A1 | 11/2012 | Muto et al. | |
| 2015/0333125 A1 | 11/2015 | Loboda et al. | |
| 2018/0202070 A1 | 7/2018 | Asamizu | |
| 2018/0251909 A1 | 9/2018 | Nakabayashi et al. | |
| 2021/0083062 A1* | 3/2021 | Shimizu | H01L 29/518 |

(Continued)

FOREIGN PATENT DOCUMENTS

| | | |
|---|---|---|
| EP | 2 514 857 B1 | 2/2018 |
| EP | 3 960 911 A1 | 3/2022 |
| KR | 10-2014-0024473 A | 2/2014 |

(Continued)

OTHER PUBLICATIONS

Extended European search report issued on Sep. 8, 2022, in counterpart European Patent Application No. 22163469.4 (149 pages).

(Continued)

*Primary Examiner* — Cuong B Nguyen
(74) *Attorney, Agent, or Firm* — NSIP Law

(57) ABSTRACT

In a silicon carbide wafer in an embodiment, in the photoluminescence signal intensity spectrum obtained after irradiating a laser on one surface of the silicon carbide wafer, the number of peak signals having an intensity more than 1.2 times the average signal intensity of the spectrum is 1/cm² or less.

7 Claims, 9 Drawing Sheets

(56) References Cited

U.S. PATENT DOCUMENTS

2021/0305369 A1* 9/2021 Nakano ................ H01L 29/739
2021/0395918 A1* 12/2021 Ma .......................... C30B 29/36

FOREIGN PATENT DOCUMENTS

| KR | 10-1654440 B1 | 9/2016 |
| KR | 10-2020-0044730 A | 4/2020 |
| KR | 10-2160863 B1 | 9/2020 |

OTHER PUBLICATIONS

Taiwanese Office Action issued on Nov. 4, 2022, in counterpart Taiwanese Patent Application No. 111109069 (4 pages in Chinese).

* cited by examiner

[FIG. 1]
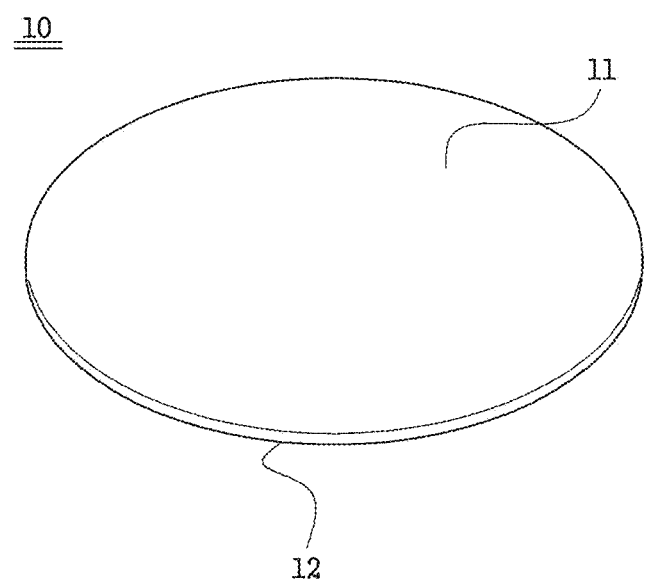

[FIG. 2]
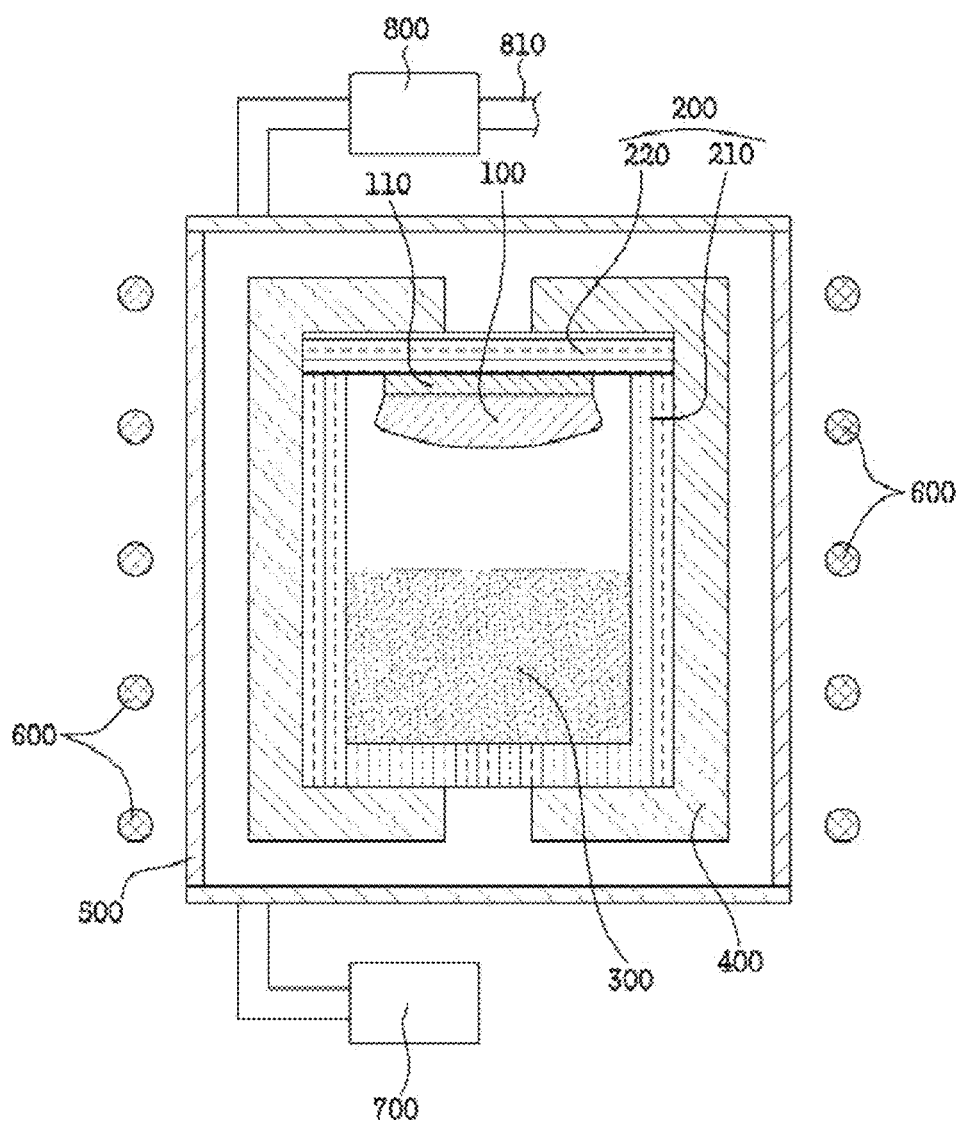

[FIG. 3]
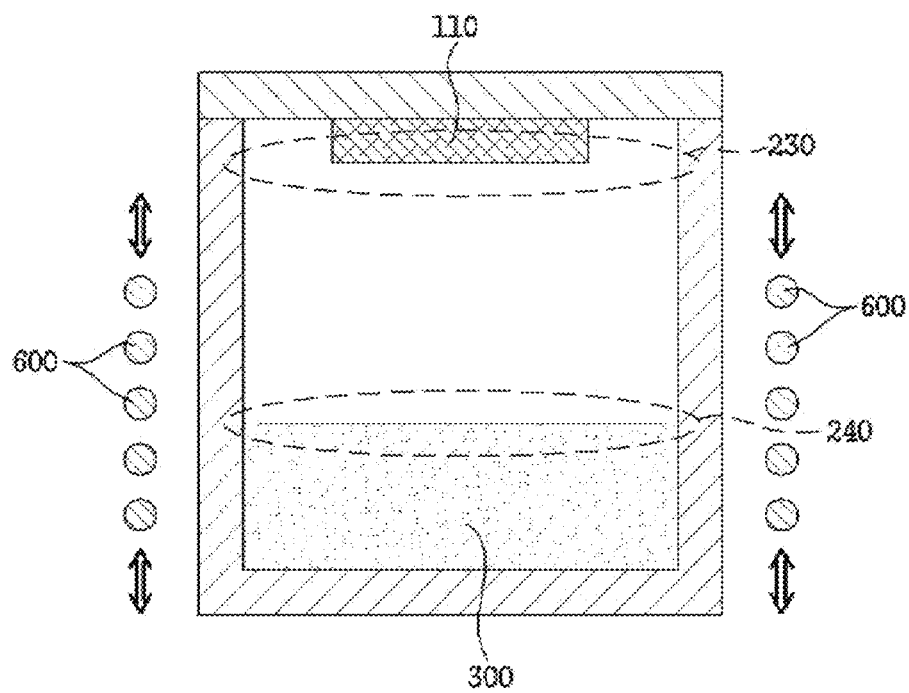

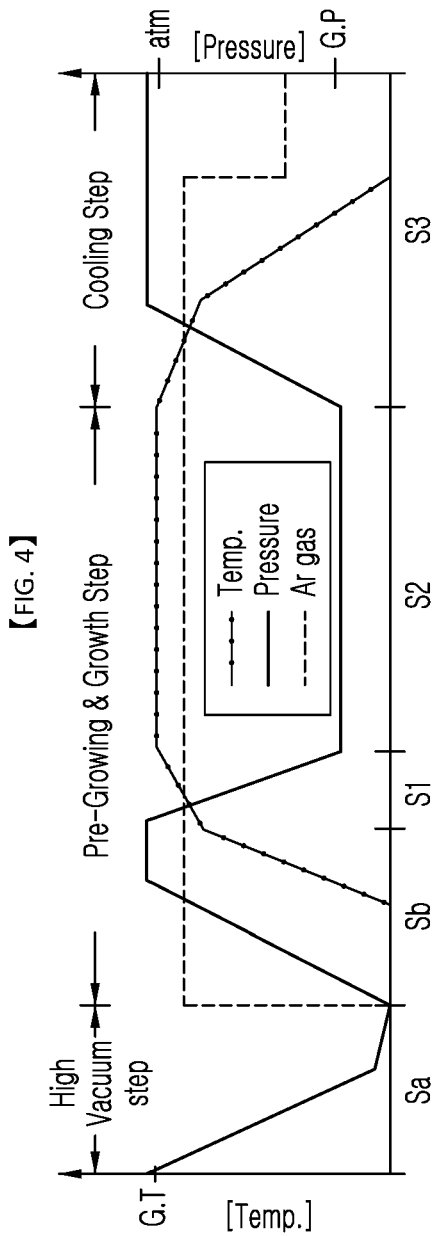
[FIG. 4]

[FIG. 5]
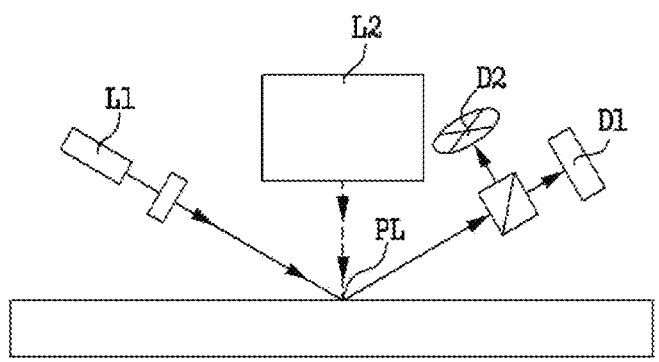
[FIG. 6]
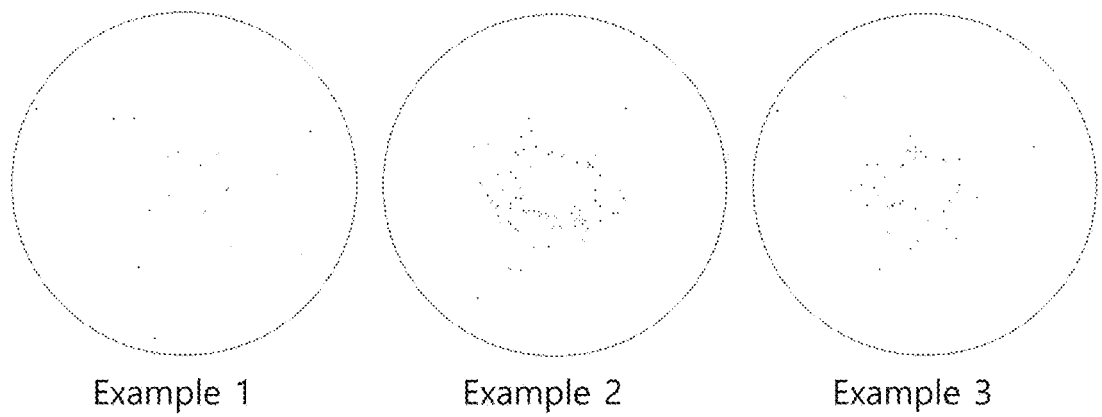
Example 1　　　　　Example 2　　　　　Example 3
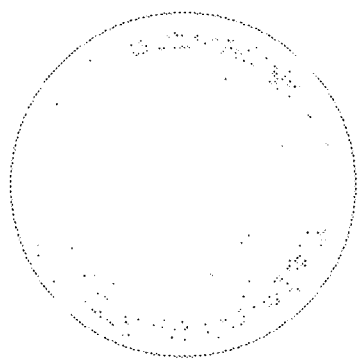
C. Example 1

[FIG. 7]
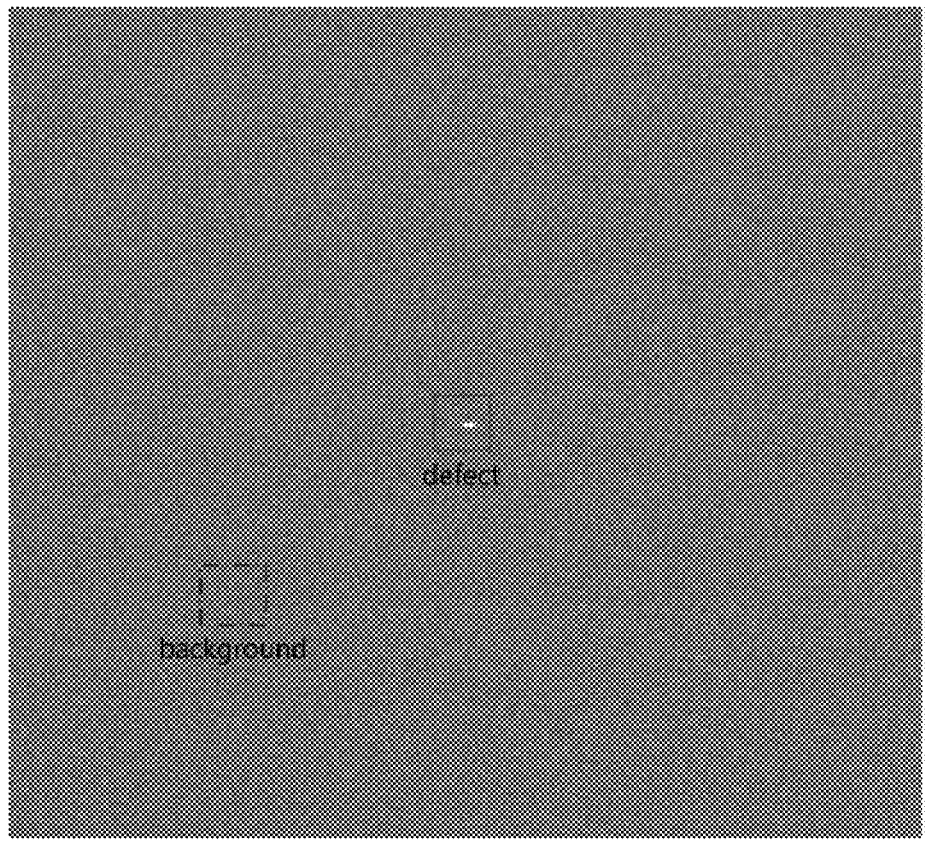

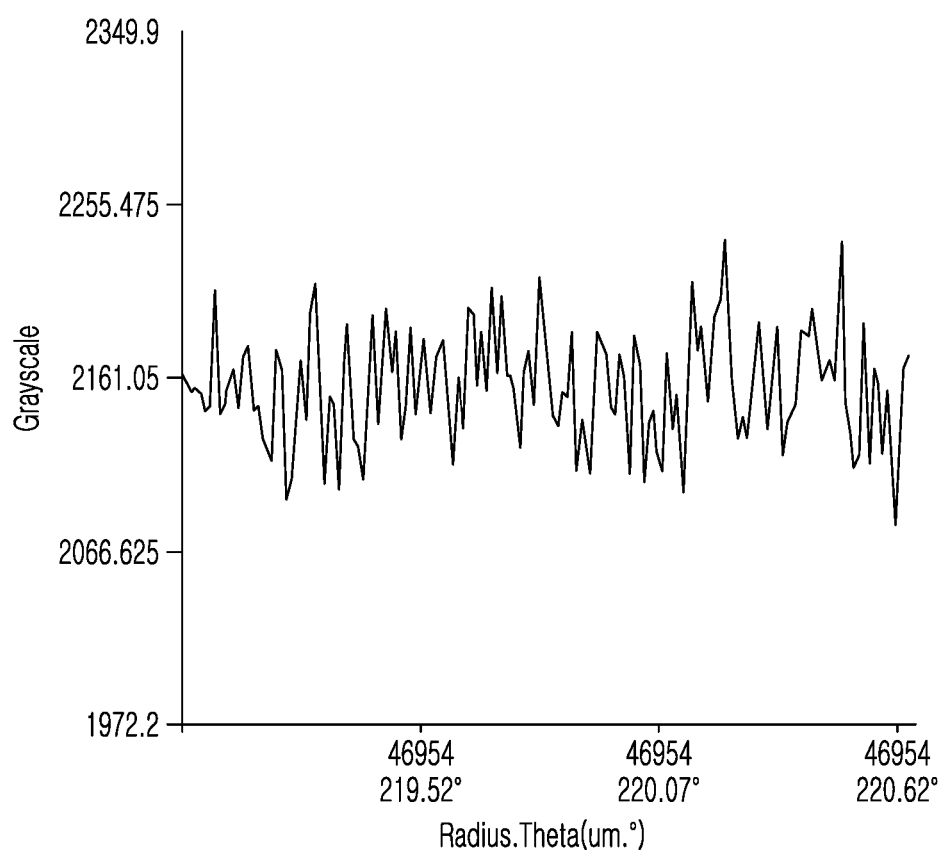
【FIG. 8】

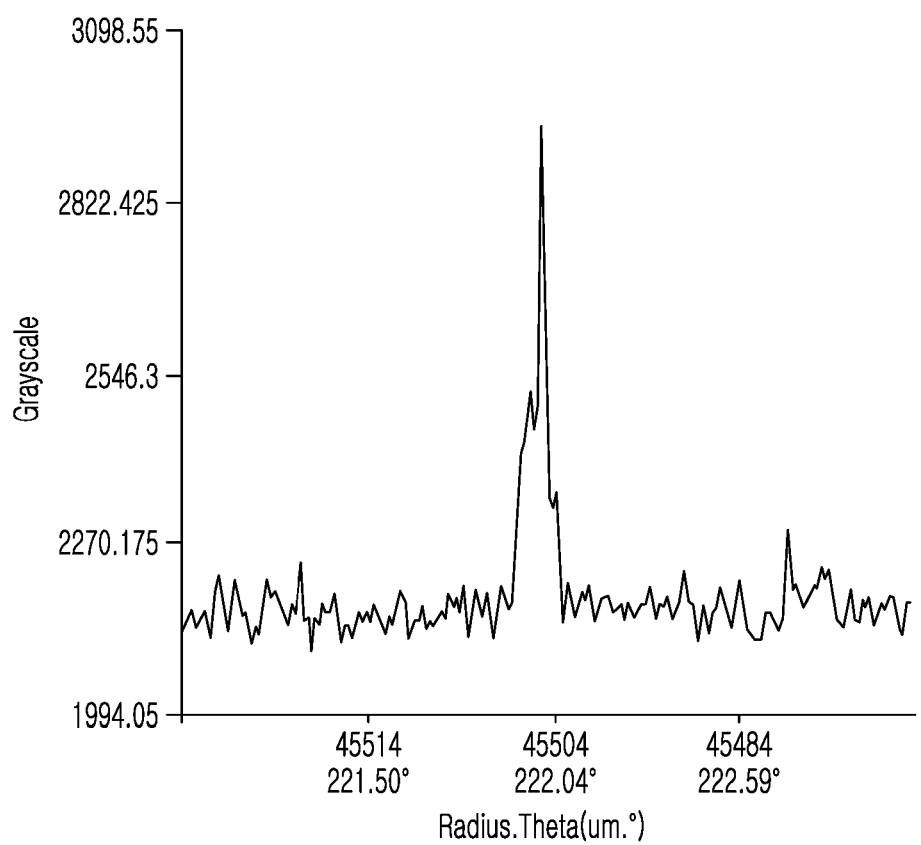

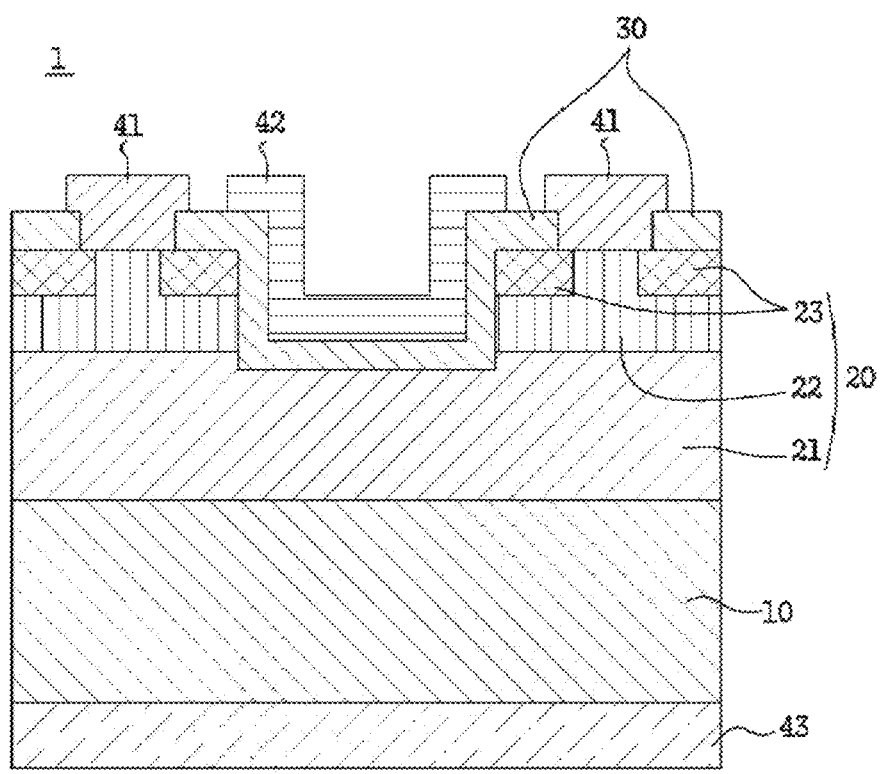
[FIG. 10]

SILICON CARBIDE WAFER AND SEMICONDUCTOR DEVICE APPLIED THE SAME

CROSS-REFERENCE TO RELATED APPLICATIONS

This application claims the benefit under 35 USC 119(a) of Korean Patent Application No. 10-2021-0041021 filed on Mar. 30, 2021 in the Korean Intellectual Property Office, the entire disclosures of which are incorporated herein by reference for all purposes.

BACKGROUND

Technical Field

The present disclosure relates to a silicon carbide wafer and a semiconductor device to which the same is applied.

Description of Art

Silicon Carbide (SiC) is a semiconductor having a wide band gab of 2.2 eV to 3.3 eV, and the research and development for SiC as a semiconductor material have been made due to its excellent physical and chemical properties.

As for methods of manufacturing a silicon carbide seed crystal, liquid phase epitaxy (LPE), chemical vapor deposition (CVD), and physical vapor transport (PVT) are known. Among them, physical vapor transport (PVT) is a method of charging a silicon carbide material inside a crucible, disposing a seed crystal consisting of silicon in upper side of the crucible, heating the crucible to sublimate the silicon carbide material by an induction heating method, and thereby growing a silicon carbide single crystal on the seed crystal.

Physical vapor transport (PVT) can manufacture a silicon carbide in an ingot shape with a high growth rate and thereby is currently the most widely used process. However, current density and temperature distribution inside the crucible change depending on properties of the crucible, the process condition, and so on, such that securing constant properties of a silicon carbide ingot and a wafer is difficult.

There is a need for an improved method capable of minimizing excessive deformation or defects caused by external factors and manufacturing ingot and wafer with minimized defects.

The information disclosed in this Description of Art section is only for enhancement of understanding of the background of the invention, and therefore it may contain information that does not form the related art that is already known to a person of ordinary skill in the art.

There are related prior technologies of "Single carbide single crystal wafer" disclosed in Korean Patent Registration No. 10-2160863, "high purity silicon carbide single crystal substrate, and manufacturing method and application thereof" disclosed in Korean Patent Publication No. 10-2020-0044730 or the like.

BRIEF DESCRIPTION

An object of the disclosure is to provide a silicon carbide wafer having less defects and excellent crystal quality.

Another object of the disclosure is to provide a silicon carbide wafer having a small number of abnormal peak signals in an intensity spectrum obtained through scattered light after laser irradiation on the surface of the silicon carbide wafer.

A silicon carbide wafer according to an embodiment includes one surface and the other surface facing each other. The one surface is a surface on which a silicon atom layer of a silicon carbide crystal is exposed and the other surface is a surface on which a carbon atom layer of a silicon carbide crystal is exposed. The number of peak signals having an intensity more than 1.2 times an average signal intensity of a spectrum in a photoluminescence signal intensity spectrum obtained by irradiating a laser on the one surface is $1/cm^2$ or less.

The number of the peak signal may be $0.54/cm^2$ or less.

The number of the peak signal in an edge region occupying 20% of a radius from an outer in a direction toward a center may be $0.05/cm^2$ or less.

The laser irradiated on the silicon carbide wafer may include a first laser having a predetermined incidence angle and a second laser being perpendicularly irradiated on the silicon carbide wafer. The first laser and the second laser may be directed at the same point. At this time, a wavelength of the first laser may be 405 nm and a wavelength of the second laser may be 355 nm.

A signal intensity of the spectrum may be a signal intensity that is converted to grayscale.

A standard deviation of the signal intensity may be 0.005 to 0.05 times the average signal intensity.

The silicon carbide wafer may be 4 inches or more and may comprise 4H silicon carbide.

The silicon carbide wafer may be a bare wafer prior to forming an epitaxial layer on a surface.

A semiconductor device according to an embodiment includes: a silicon carbide wafer that is described above; an epitaxial layer disposed on the one surface of the silicon carbide wafer; a barrier region facing the silicon carbide wafer with the epitaxial layer interposed therebetween; a source electrode in contact with the epitaxial layer; a gate electrode disposed on the barrier region; and a drain electrode disposed on the other surface of the silicon carbide wafer.

According to the embodiment, in an image map obtained by irradiating a laser on one surface of a silicon carbide wafer and detecting scattered or reflected light, wafer polar coordinates-intensity spectrum, the number of abnormal peak signals is determined, and a silicon carbide wafer having small number of abnormal peak signals is provided, so more improved device characteristics and yield can be expected.

BRIEF DESCRIPTION OF THE DRAWINGS

FIG. 1 is a conceptual view for showing an example of a silicon carbide wafer according to an embodiment.

FIG. 2 is a conceptual view for showing an example of a manufacturing device of a silicon carbide ingot.

FIG. 3 is a conceptual view for an inner space of a reactor of a manufacturing device of a silicon carbide ingot.

FIG. 4 is a graph showing changes of temperature, pressure and argon gas pressure with respect to time in the manufacturing process of the silicon carbide wafer according to an embodiment.

FIG. 5 is a conceptual view of an example of a process for detecting defects, impurities etc. of a silicon carbide wafer according to an embodiment.

FIG. 6 is an image map showing abnormal peak signals of embodiment examples (Example 1, 2 and 3) and a comparative example 1(C.Example 1)

FIG. 7 is a dark portion image map showing defects and background other than defects measured by Candela 8520 of a silicon carbide wafer according to an embodiment.

FIG. 8 is a polar-grayscale intensity spectrum of a background other than detects measured by Candela 8520 of a silicon carbide wafer according to an embodiment.

FIG. 9 is a polar-grayscale intensity spectrum of defects and a background other than detects measured by Candela 8520 of a silicon carbide wafer according to an embodiment.

FIG. 10 is a schematic diagram of an example of a semiconductor device according to an embodiment.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. Throughout the specification the same reference numeral is used for the similar part.

Throughout the present disclosure, the phrase that a certain element "comprises" or "includes" another element means that the certain element may further include one or more other elements but does not preclude the presence or addition of one or more other elements, unless stated to the contrary.

Throughout the present disclosure, it will be understood that when an element is referred to as being "connected" to another element, it can be directly connected to the other element or intervening elements may be present.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device.

In this application, the phrase "combination(s) thereof" included in a Markush-type expression denotes one or more mixtures or combinations selected from the group consisting of components stated in the Markush-type expression, that is, denotes that one or more components selected from the group consisting of the components are included.

In this disclosure, the description "A and/or B" means "A or B, or A and B."

In this disclosure, terms such as "first," "second," "A," or "B" are used to distinguish the same terms from each other. The singular forms "a," "an," and "the" include the plural form unless the context clearly dictates otherwise.

In this disclosure, a singular form is contextually interpreted as including a plural form as well as a singular form unless specially stated otherwise.

Silicon Carbide Wafer 10

A silicon carbide wafer 10 according to an embodiment includes one surface 11 and the outer surface 12 that are opposite to each other, wherein the one surface is a surface where silicon atom layer of a silicon carbide crystal is exposed and the other surface is a surface where carbon atom layer of a silicon carbide crystal is exposed, and wherein in the one surface the number of a peak signal having an intensity more than 1.2 times an average signal intensity of a photoluminescence signal intensity spectrum obtained after irradiating laser on the one surface of the silicon carbide wafer may be $1/cm^2$ or less.

Defects in a silicon carbide wafer can be identified through scanning electron microscope (SEM), atomic force microscope (AFM) or the like after etching the surface using molten KOH. However, this method may cause damage to the wafer and is inefficient in measuring the defects of a plurality of wafers, and it is difficult to easily identify some defects so that it is not suitable for mass production of wafers.

As shown in FIG. 5, the inventors identified the number of the abnormal peak signal in the image map, the polar coordinate-intensity spectrum of the wafer obtained by irradiating a laser on the one surface of the silicon carbide wafer and detecting the photoluminescence and provided the silicon carbide wafer having small number of the abnormal peak signal, so that more improved device characteristics and yield can be expected.

The detection of impurities and defects of the wafer through a laser may be performed through Candela 8520 of KLA-Tencor and may be exemplarily performed as follows. Referring to FIG. 5, first, a first device L1 irradiates a first laser with a wavelength of 405 nm at a predetermined angle of incidence, and a second device L2 perpendicularly irradiates a second laser of 355 nm. At this time, the first laser and the second laser are directed to the same place. Irradiation is performed from the surface edge of the silicon carbide wafer rotating at a high speed to a center thereof, so that all areas of the surface of the silicon carbide wafer are irradiated. If the first laser of the first device and the second laser of the second device are irradiated on impurities and detects on the surface of the silicon carbide wafer, a portion of the irradiated laser is scattered, or the intensity of the reflected light is reduced, or photoluminescence PL may be formed. By directly detecting such scattered light, the reflected light or the photoluminescence through the second device, a first detector D1, a second detector D2 and the like, impurities, defects and the like can be detected. Intensities of the first laser, the second laser, the photoluminescence, the scattered light and the reflected light are electronically recorded and an image map that shows the relative intensity of one or more of the photoluminescence, the scattered light and the reflected light on the surface of the wafer as shown in FIG. 6 and FIG. 7 can be formed or the relative intensity of the defects or the impurities with respect to periphery as the polar coordinate-greyscale intensity spectrum of FIG. 8 and FIG. 9 can be identified. The map can provide information on the size and the location of the defect.

The laser may have a predetermined angle of incidence with respect to a line perpendicular to the surface of the silicon carbide wafer. For example, the first laser of the first device L1 may have an incidence angle of any one of an incidence angle of 20° to 70° and may have an incidence angle of 60°. The second laser of the second device may be irradiated perpendicular to the surface of the silicon carbide wafer.

The first laser of the first device L1 may include a separate polarizer in the path to which the first laser is irradiated.

The first detector D1 and the second detector D2 may further include a separate splitter in the path of the reflected light or the scattered light to detect through a single photodiode and a quad position sensing detector (Quad PSD).

In the photoluminescence signal intensity spectrum obtained after irradiating the laser on one surface of the silicon carbide wafer, the average signal intensity of the spectrum may be an average intensity of grayscale conversion of signal intensity of the photoluminescence after irradiating laser on the silicon carbide wafer.

In the silicon carbide wafer 10, the number of the peak signal having an intensity more than 1.2 times the average signal intensity of the spectrum may be 1/cm² or less, or 0.54/cm² or less, or 0.25/cm² or less. In the silicon carbide wafer, the number of the peak signal may be 0.01/cm² or more. The peak signal may have an intensity lower than 25 times the average signal intensity. A silicon carbide wafer having such a number of the peak signal has an excellent crystallinity, can minimize defect formation in a subsequent epitaxial process, etc., and can have good characteristics and yield during device manufacturing.

In the silicon carbide 10, the number of the peak signal having an intensity 1.3 to 20 times higher than the average signal intensity of the spectrum may be 0.5/cm² or less, or 0.2/cm² or less. In the silicon carbide wafer, the number of the peak signal may be 0.01/cm² or more. A silicon carbide wafer having such a number of the peak signal has an excellent crystallinity, can minimize defect formation in a subsequent epitaxial process, etc., and can have good characteristics and yield during device manufacturing.

In the edge region occupying 20% of the radius from the outer in a direction toward the center of the silicon carbide wafer 10, the number of the peak signal having an intensity more than 1.2 times the average signal intensity may be 0.05/cm² or less, 0.03/cm² or less. In the silicon carbide wafer, the number of the peak signal in the edge region may be 0.005/cm² or more. A silicon carbide wafer having such a number of the peak signal can have good characteristics and yield during device manufacturing.

The signal intensity of the spectrum may be an intensity that is converted into a greyscale intensity of the photoluminescence.

The standard deviation of the signal intensity in the spectrum may be 0.005 to 0.05 times the average signal intensity, or 0.008 to 0.03 times the average signal intensity. A silicon carbide wafer having such a standard deviation of the signal intensity may exhibit even crystal quality, and a subsequent device manufacturing process may be easily performed.

The diameter of the silicon carbide wafer 10 may be 4 inches or more, 5 inches or more, and 6 inches or more. The diameter of the wafer may be 12 inches or less and may be 10 inches or less.

The silicon carbide wafer 10 may include 4H silicon carbide and may be made of 4H silicon carbide.

The laser irradiated to the silicon carbide wafer 10 includes a first laser having a predetermined incident angle and a second laser irradiated perpendicular to the silicon carbide wafer, the wavelength of the first laser may be 405 nm, and the wavelength of the second laser may be 355 nm.

The silicon carbide wafer 10 may be a bare wafer before forming an epitaxial layer on the surface. Exemplarily, the silicon carbide wafer may be a bare wafer after being cut from a silicon carbide ingot and subjected to planarization and chemical mechanical polishing.

As shown in FIG. 1, the silicon carbide wafer 10 may include a Si surface that is the one surface 11 on which a silicon atom layer appears and a C surface that is the other surface 12 on which a carbon atom layer appears. When a silicon carbide wafer is manufactured by cutting the silicon carbide ingot, the cutting is easily made on a boundary surface between the carbon atom layer and the silicon atom layer of the silicon carbide single crystal or along a direction parallel thereto. Accordingly, the surface to which carbon atoms are mainly exposed and the surface to which silicon atoms are mainly exposed appear on the cut surface.

The Ra roughness of the Si surface that is the one surface 11 of the silicon carbide wafer 10 may be 0.3 nm or less and may be 0.2 nm or less. The Ra roughness of the one surface may be 0.01 nm or more. A wafer having such a roughness range may have improved electrical properties during device manufacturing through a subsequent process.

The silicon carbide wafer 10 may have a thickness of 100 μm to 900 μm, and the thickness is not limited thereto as long as it is an appropriate thickness applicable to a semiconductor device.

The silicon carbide wafer 10 may be manufactured through a method of manufacturing a silicon carbide wafer to be described later.

Manufacturing Method of Silicon Carbide Wafer

In order to achieve the above object, the method of manufacturing a silicon carbide wafer according to the embodiment includes: a preparation step of disposing raw material 300 and a silicon carbide seed crystal 110 to be spaced apart from each other in a reaction vessel 200 having an inner space; a growth step of sublimating the raw material by controlling temperature, pressure and atmosphere of the inner space and preparing a silicon carbide ingot grown from the silicon carbide seed crystal; a cooling step of cooling the reaction vessel and recovering the silicon carbide ingot; and a cutting step of preparing a silicon carbide wafer by cutting the recovered silicon carbide ingot. The reaction vessel includes a heat insulating material 400 surrounding the outer surface, and a heating means 600 for controlling the temperature of the inner space. The growth step includes: a temperature raising process of raising the temperature of the inner space from room temperature to a first temperature; a first growth process of raising the temperature from a first temperature to a second temperature; and a second growth process for maintaining the second temperature. The first temperature is a temperature at which the pressure decrease of the inner space starts, and the second temperature is a temperature for inducing growth of the silicon carbide ingot under the reduced pressure as a result of the pressure decrease of the inner space. The temperature difference is the difference between temperatures of the upper portion and the lower portion of the inner space, and the temperature difference at the first temperature is 30° C. to 80° C.

The upper portion of the inner space is an area in which the silicon carbide seed crystal 110 is located, and a lower portion of the inner space is an area in which the raw material 300 is located.

FIG. 2 shows an example of a silicon carbide ingot manufacturing device. With reference to this, a method of manufacturing a silicon carbide wafer according to an embodiment will be described.

In the preparation step, the raw material 300 and the silicon carbide seed crystal 110 are spaced apart from each other in the reaction vessel 200 having an inner space and are arranged to face each other.

The silicon carbide seed crystal 110 may be of an appropriate size depending on the desired silicon carbide wafer, and the C surface ((000-1) surface) of the silicon carbide seed crystal may be directed toward the raw material 300.

The silicon carbide seed crystal may include 4H silicon carbide of 4 inches or more.

The raw material 300 may be applied in the form of a powder having a carbon source and a silicon source, and a raw material in which the powder is necked to each other or silicon carbide powder in which the surface is carbide-treated may be applied.

The reaction vessel 200 may be applied as long as it is an appropriate vessel for the silicon carbide ingot growth reaction, and specifically, a graphite crucible may be applied. For example, the reaction vessel may include a body 210 including an inner space and an opening, and a cover 220 corresponding to the opening to seal the inner space. The cover may further include a seed crystal holder integrally or separately and may fix the silicon carbide seed crystal through the seed crystal holder so that the silicon carbide seed crystal 110 and the raw material 300 face each other.

The reaction vessel 200 may be fixed by being surrounded by the heat insulating material 400, and the heat insulating material surrounding the reaction vessel may be located in a reaction chamber 500 such as a quartz tube. A heating means 600 is provided outside the heat insulating material and the reaction chamber to control the temperature of the inner space of the reaction vessel.

The heat insulating material 400 may have a porosity of 72% to 95%, 75% to 93%, and 80% to 91%. When a heat insulating material satisfying such porosity is applied, the occurrence of cracks in the grown silicon carbide ingot can be further reduced.

The insulating material 400 may have a compressive strength of 0.2 MPa or more, 0.48 MPa or more, and 0.8 MPa or more. In addition, the heat insulating material may have a compressive strength of 3 MPa or less, and 2.5 MPa or less. When the heat insulating material has such compressive strength, it is possible to manufacture a silicon carbide ingot of superior quality due to excellent thermal/mechanical stability and a low probability of occurrence of ash.

The heat insulating material 400 may include carbon-based felt, specifically graphite felt, and may include rayon-based graphite felt or pitch-based graphite felt.

The reaction chamber 500 may include a vacuum exhaust device 700 that is connected to the inside of the reaction chamber and controls the degree of vacuum inside the reaction chamber, a pipe 810 that is connected to the inside of the reaction chamber and introduces gas into the reaction chamber and a mass flow controller 800 for controlling gas inflow. Through these, it is possible to adjust the flow rate of the inert gas in the subsequent growth step and the cooling step.

The growth step may be performed by heating the reaction vessel 200 and the inner space of the reaction vessel by the heating means 600, and simultaneously with or separately from the heating, by decompressing the inner space to adjust the degree of vacuum and supplying an inert gas, the growth of silicon carbide ingots can be induced.

The heating means 600 may be installed to be movable in the vertical direction of the reaction vessel 200, and accordingly, the relative position between the reaction vessel and the heating means may be changed, and a temperature difference may be applied between the upper portion 230 of the inner space and the lower portion 240 of the inner space. Specifically, a temperature difference may be applied to the silicon carbide seed crystal 110 in the upper portion of the inner space and the raw material 300 in the lower portion.

The heating means 600 may be formed in a spiral coil along the outer peripheral surface of the reaction vessel 200 or the heat insulating material 400 surrounding the reaction vessel.

Referring to FIG. 4, the growth step includes: a temperature raising process Sb of raising the temperature of the inner space from room temperature to a first temperature; a first growth process S1 of raising the temperature from the first temperature to the second temperature; and a second growth process S2 of maintaining the second temperature, and thereby provides a silicon carbide ingot.

Before the growth step, a decompression process Sa of decreasing pressure of the inner space in the atmospheric state may be included.

The temperature increase to the first temperature may be performed at a rate of 3° C./min to 13° C./min, and may proceed at a rate of 5° C./min to 11° C./min. The temperature increase to the pre-growth start temperature may be performed at a rate of 7° C./min to 10° C./min.

The decompression process Sa may be made so that the pressure of the inner space is 10 torr or less, 5 torr or less.

The temperature raising process Sb may be made by injecting an inert gas such as argon or nitrogen so that the pressure of the inner space becomes 500 to 800 torr, and the temperature increase may be performed at a rate of 1° C./min to 10° C./min so that the lower portion of the inner space becomes at a temperature of 1500° C. to 1700° C.

Referring to FIG. 3, in the growth step, the upper portion 230 of the inner space may be a position corresponding to the surface of the silicon carbide seed crystal 110, and the lower portion 240 of the inner space may be a position corresponding to the surface of the raw material 300.

The first temperature is a temperature at which the sublimation of the raw material 300 starts partially. The first temperature may be a temperature that has been subjected to the temperature increase process Sb before the growth stage as shown in the dotted line region of FIG. 4 and may be a temperature at which decompression of the internal space starts after injection of inert gas in the temperature increase step. Specifically, it may be 1500° C. to 1700° C., or 1520° C. to 1660° C., based on the lower portion 240 of the inner space.

The first temperature may be 1400° C. to 1650° C., or 1450° C. to 1600° C., based on the upper portion 230 of the inner space.

In the first growth process S1, the temperature difference between the upper portion 230 of the inner space and the lower portion 240 of the inner space at the first temperature may be 30° C. to 80° C. and may be 40° C. to 70° C.

The second temperature is a temperature at which the sublimation of the raw material 300 proceeds intensively. As shown in the dotted line region of FIG. 4, the second temperature may be a temperature at which the temperature is raised in the first growth process and a temperature at which the growth of the silicon carbide ingot is induced under the reduced pressure in the inner space. In addition, it is possible to induce the growth of the silicon carbide ingot while changing the pressure within ±10% of the reduced pressure at the second temperature.

The second temperature may be 2100° C. to 2400° C., 2300° C. to 2350° C., based on the lower portion 240 of the inner space.

The second temperature may be 1900° C. to 2300° C., 2100° C. to 2250° C., based on the upper portion 230 of the inner space.

In the first growth process S1, the temperature difference between the upper portion 230 of the inner space and the lower portion 240 of the inner space at the second temperature may be 150° C. to 250° C., or 180° C. to 220° C.

In the first growth process S1, the temperature difference between the upper portion 230 of the inner space and the lower portion 240 of the inner space may increase as the temperature of the inner space rises.

The temperature difference at the second temperature may be 120° C. to 180° C. greater than the temperature difference at the first temperature, and 130° C. to 150° C. greater than the temperature difference at the first temperature.

The first growth process S1 has a temperature range, a temperature difference, and a change amount of the temperature difference between the upper portion 230 of the inner space and the lower portion 240 of the inner space, so the generation of polymorphism other than the target crystal when the initial silicon carbide ingot is formed can be minimized and stable ingot growth can be made possible. If the temperature difference is less than the above-mentioned range of temperature difference at the first temperature and the second temperature of the first growth process, the possibility of forming polycrystals increases due to the mix of crystals other than the target crystal and there is a risk that the growth rate may be lowered. On the other hand, if the temperature difference is greater than the above-mentioned range of temperature difference, the crystal quality may be deteriorated.

In the first growth process S1, the pressure may be decreased together with the temperature increase from the first temperature to the second temperature, and the pressure may be decreased to 1 to 50 torr.

The temperature increase rate of the first growth process S1 may be smaller than the temperature increase rate of the temperature increase process Sb. The temperature increase rate of the first growth process S1 may be smaller than the average temperature increase rate of the whole of the temperature increase process and the first growth process.

The temperature increase rate of the first growth process S1 may be 1° C./min to 5° C./min, and 3° C./min to 5° C./min. In such temperature increase rate range, it is possible to prevent the occurrence of polymorphisms other than the target crystal and to induce stable growth.

The first growth process S1 may be performed such that the maximum heating area of the heating means 600 becomes the lower portion 240 of the inner space and the surface 240 of the raw material 300, and if the heating means is a spiral coil shape, the desired temperature difference between the upper portion 230 of the inner space and the lower portion 240 of the inner space can be applied by changing the number and thickness of winding.

In the second growth process S2, after the temperature is raised to the second temperature in the first growth process S1, the second temperature is maintained to sublimate the raw material 300 intensively to form a silicon carbide ingot. The second growth process S2 may be performed for 5 to 180 hours, 30 to 160 hours, and 50 to 150 hours.

The growth step may be performed while rotating about a rotation axis of the upper and lower direction of the reaction vessel 200, and the temperature gradient may be maintained more constantly.

In the growth step, an inert gas of a predetermined flow rate may be applied to the outside of the reaction vessel 200. The inert gas may flow into the inner space of the reaction vessel, and the flow may be made in the direction from the raw material 300 to the silicon carbide seed crystal 110. Accordingly, a stable temperature gradient of the reaction vessel and the inner space can be formed.

Specifically, the inert gas in the growth step may be argon, helium, or a mixture thereof.

In the cooling step S3, the silicon carbide ingot grown through the growth step is cooled at a predetermined cooling rate and a predetermined inert gas flow rate conditions.

In the cooling step S3, cooling may be performed at a rate of 1° C./min to 10° C./min, and cooling may be performed at a rate of 3° C./min to 9° C./min. In the cooling step, cooling may be performed at a rate of 5° C./min to 8° C./min.

In the cooling step S3, the pressure of the inner space of the reaction vessel 200 may be controlled at the same time, and the pressure may also be controlled separately from the cooling step. The pressure adjustment may be performed so that the pressure of the inner space is up to 800 torr.

In the cooling step S3, similarly to the growth step, an inert gas at a predetermined flow rate may be applied to the inside of the reaction vessel 200. The inert gas may be, for example, argon or nitrogen. The inert gas may flow into the inner space of the reaction vessel, and the flow may be made in the direction from the raw material 300 to the silicon carbide seed crystal 110.

In the cooling step S3, the pressure of the inner space of the reaction vessel 200 is pressurized to be above atmospheric pressure, and the cooling step may include: a first cooling process of cooling the temperature of the inner space so that the temperature of the inner space becomes 1500° C. to 1700° C. based on the upper part 230; and a second cooling process of cooling the temperature of the internal space to room temperature after the first cooling process.

The recovery of the cooling step S3 may be performed by cutting the rear surface of the silicon carbide ingot 100 in contact with the silicon carbide seed crystal 110. The silicon carbide ingot cut in this way can minimize the loss of the rear surface in contact with the seed crystal and can exhibit improved crystal quality.

In the cutting step, the silicon carbide ingot 100 may be cut to form a predetermined off-angle with the (0001) surface or the growth started surface. The off-angle of the cutting step may be 0° to 10°.

In the cutting step, the thickness of the wafer may be 150 μm to 900 μm, and 200 μm to 600 μm, but is not limited thereto.

After the cutting step, it may further include a processing step of planarizing the thickness of the prepared silicon carbide wafer and polishing the surface.

In the processing step, the grinding wheel may be in a form in which particles are embedded in the surface, and the particles embedded in the surface of the grinding wheel may be diamonds.

The processing step may be performed while the grinding wheel and the wafer rotate in opposite directions.

In the processing step, the diameter of the grinding wheel may be greater than the diameter of the wafer, and may be 250 mm or less.

The method may further include wet etching the silicon carbide wafer after the processing step.

The processing step may further include a chemical mechanical polishing step.

The chemical mechanical polishing may be performed by applying an abrasive particle slurry on a rotating surface plate and contacting a wafer fixed to a rotating polishing head with a predetermined pressure.

After the processing step, a cleaning step through a conventional RCA chemical cleaning solution may be further performed.

The wafer manufactured through the above manufacturing method has advantages of low defect density, small number of impurity particles, and good surface properties, and when applied to device manufacturing, a device having excellent electrical and optical properties can be manufactured.

Semiconductor Device 1

In order to achieve the above object, the semiconductor according to an embodiment includes: a silicon carbide wafer 10 according to the above; an epitaxial layer 21 disposed on one surface of the silicon carbide wafer; a barrier region 30 disposed to face the silicon carbide wafer with the epitaxial layer interposed therebetween; a source electrode 41 in contact with the epitaxial layer; a gate electrode 42 disposed on the barrier region; and a drain electrode 43 disposed on the other surface of the silicon carbide wafer.

An example of the semiconductor device 1 is shown in FIG. 10.

The silicon carbide wafer 10 may include $n^+$ type silicon carbide.

Here, the + and − signs of the superscripts indicate relatively carrier concentrations. For example, $n^+$ means an n type semiconductor that is strongly doped and has a high dopant concentration, and $p^-$ means p type semiconductor that is very lightly doped and a relatively low dopant concentration.

The epitaxial layer 20 on the silicon carbide wafer 10 may be formed of a silicon carbide single crystal layer having a small or no lattice constant difference from the silicon carbide wafer.

The epitaxial layer 20 may be formed by a chemical vapor deposition (CVD) process or the like.

The epitaxial layer 20 may include an $n^-$ type epitaxial layer 21 disposed on the $n^+$ type silicon carbide wafer 10; and a $p^+$ type epitaxial layer 22 disposed on the $n^-$ type epitaxial layer.

An $n^+$ type region 23 may be formed by applying selective ion implantation on the $p^+$ type epitaxial layer.

A barrier region having a trench structure excavated up to the $n^-$ type epitaxial layer 21 and the gate electrode 42 disposed on the barrier region of the trench structure may be disposed in the center of the semiconductor device 1.

The silicon carbide wafer 10 manufactured according to the method for manufacturing the silicon carbide ingot and wafer is applied to the semiconductor device 1, so the defect rate can be reduced.

Hereinafter, the present invention will be described in more detail through specific examples. The following examples are merely illustrative to help the understanding of the present invention, and the scope of the present invention is not limited thereto.

Example 1—Preparation of Silicon Carbide Wafer

As shown in FIG. 2 as an example of an apparatus for manufacturing a silicon carbide ingot, a silicon carbide powder, which is a raw material 300, is charged in the lower portion of the inner space of the reaction vessel 200, and a silicon carbide seed crystal 110 is disposed on the upper portion. At this time, the silicon carbide seed crystal composed of 6-inch 4H-silicon carbide crystal was applied and was fixed in a conventional manner so that the C surface ((000-1) surface) was directed to the silicon carbide raw material disposed at the bottom of the inner space.

After sealing the reaction vessel 200 and surrounding the outside thereof with a heat insulating material 400, the reaction vessel was disposed within a quartz tube 500 provided with a heating coil serving as a heating means 600 on the outside. The inner space of the reaction vessel was reduced in pressure to adjust to a vacuum atmosphere, and argon gas was injected so that the inner space reached 760 torr.

Then, at the same time as depressurizing the inner space again, the temperature of the inner space was raised at a rate of 7° C./min to 10° C./min to the first temperature of Example 1 of Table 1 based on the lower portion. In the first growth process, the temperature was raised at a rate of 3° C./min to 5° C./min at the same time as the pressure was reduced, and the temperature and pressure of the upper portion of the inner space and the lower portion of the inner space were set to be the conditions of the examples in Table 1. After reaching the operating temperature, temperature difference, and pressure of Examples in Table 1, the silicon carbide ingot was grown for 80 to 140 hours while maintaining the same conditions.

After growth, the temperature of the inner space was cooled to 25° C. at a rate of 5° C./min to 8° C./min, and at the same time, argon or nitrogen gas was injected so that the pressure of the inner space became 760 torr to cool the silicon carbide ingot.

The outer peripheral surface of the cooled silicon carbide ingot was ground and processed into a form having a uniform outer diameter, cutting was made to have an off angle of 4° with the (0001) surface of the silicon carbide ingot, and a silicon carbide wafer having a thickness of 360 μm was prepared. Then, the silicon carbide wafer was polished through a diamond wheel to flatten the thickness, followed by chemical mechanical polishing with silica slurry.

Example 2—Preparation of Silicon Carbide Wafer

In Example 1, a silicon carbide wafer was prepared by changing the temperature conditions during pre-growth and growth to those of Table 1 below.

Example 3—Preparation of Silicon Carbide Wafer

In Example 1, a silicon carbide wafer was prepared by changing the temperature conditions during pre-growth and growth to those of Table 1 below.

Comparative Example 1—Preparation of Silicon Carbide Wafer

In Example 1, a silicon carbide wafer was prepared by changing the temperature conditions during pre-growth and growth to those of Table 1 below.

Experimental Example 1—Defect/Impurity Preparation of Silicon Carbide Wafer

Through the Candela 8520 device of KLA-Tencor, the silicon carbide wafers of Examples 1 to 3 and Comparative Example 1 were rotated, and at the same time, as shown in FIG. 5, a first laser of the first device L1 having a wavelength of 405 nm and a predetermined incidence angle and a second laser of the second device L2 having a wavelength of 355 nm and being perpendicularly irradiated were irradiated on the surface of the silicon carbide wafer from the edge to the center. Accordingly, an image map was formed by detecting photoluminescence, and a grayscale intensity spectrum of photoluminescence according to polar coordinates was formed based on the center of the silicon carbide wafer, and the results are shown in FIG. 6 to FIG. 9 and Table 1 etc. In this case, a peak signal having an intensity of 1.2 to 25 times the average signal intensity of the spectrum was regarded as an abnormal signal.

Referring to FIG. 6 and Table 1, it is confirmed that Example 1 has 17, Example 2 has 97, and Example 3 has 44 abnormal signals (peak signals on the spectrum) over the entire surface of the silicon carbide wafer, and it can be seen that in the comparative example, more than 400 signals were shown.

TABLE 1

| | First temperature (pre-growth) | | | Second temperature (growth) | | | Number of abnormal signal (for 6 inches wafer) |
|---|---|---|---|---|---|---|---|
| | Temperature of lower portion | Temperature of upper portion | Temperature difference | Temperature of lower portion | Temperature of upper portion | Temperature difference | |
| Example 1 | 1590 | 1550 | 40 | 2350 | 2170 | 180 | 17 |
| Example 2 | 1520 | 1450 | 70 | 2340 | 2120 | 220 | 97 |
| Example 3 | 1660 | 1600 | 60 | 2300 | 2110 | 190 | 44 |
| Comparative example 1 | 1770 | 1680 | 90 | 2440 | 2140 | 300 | 433 |

Temperature unit: ° C.

In addition, as a result of manufacturing a device based on the silicon carbide wafer of Examples 1 to 3, it was confirmed that the device had a good yield compared to Comparative Example.

Although preferred embodiments of the present invention have been described in detail above, the scope of the present invention is not limited thereto, and various modifications and improvements by those skilled in the art using the basic concept of the present invention as defined in the following claims are also within the scope of the invention.

What is claimed is:

1. A silicon carbide wafer comprising one surface and another surface facing each other, wherein the one surface is a surface on which a silicon atom layer of a silicon carbide crystal is exposed and the other surface is a surface on which a carbon atom layer of a silicon carbide crystal is exposed, and wherein a number of peak signals per unit area having an intensity more than 1.2 times an average signal intensity of a spectrum in a photoluminescence signal intensity spectrum obtained by irradiating lasers on the one surface is $1/cm^2$ or less, wherein the lasers irradiated on the silicon carbide wafer comprise a first laser having a predetermined incidence angle and a second laser being perpendicularly irradiated on the silicon carbide wafer, wherein the first laser and the second laser are directed at the same point, and wherein a wavelength of the first laser is 405 nm and a wavelength of the second laser is 355 nm, and wherein a signal intensity of the spectrum is a signal intensity that is converted to grayscale.

2. The silicon carbide wafer according to claim 1, wherein the number of the peak signal per unit area is $0.54/cm^2$ or less.

3. The silicon carbide wafer according to claim 1, wherein the number of the peak signal per unit area in an edge region occupying 20% of a radius from an outer in a direction toward a center is $0.05/cm^2$ or less.

4. The silicon carbide wafer according to claim 1, wherein a standard deviation of the signal intensity is 0.005 to 0.05 times the average signal intensity.

5. The silicon carbide wafer according to claim 1, wherein the silicon carbide wafer is 4 inches or more and comprises 4H silicon carbide.

6. The silicon carbide wafer according to claim 1, wherein the silicon carbide wafer is a bare wafer prior to forming an epitaxial layer on a surface.

7. A semiconductor device comprising:
the silicon carbide wafer according to claim 1;
an epitaxial layer disposed on the one surface of the silicon carbide wafer;
a barrier region facing the silicon carbide wafer with the epitaxial layer interposed therebetween;
a source electrode in contact with the epitaxial layer;
a gate electrode disposed on the barrier region; and
a drain electrode disposed on the other surface of the silicon carbide wafer.

* * * * *